United States Patent [19]

Sakuma et al.

[11] Patent Number: 5,270,247
[45] Date of Patent: Dec. 14, 1993

[54] ATOMIC LAYER EPITAXY OF COMPOUND SEMICONDUCTOR

[75] Inventors: Yoshiki Sakuma; Masashi Ozeki; Nobuyuki Ohtuka, all of Kawasaki; Kunihiko Kodama, Takarazuka, all of Japan

[73] Assignee: Fujitsu Limited, Kawasaki, Japan

[21] Appl. No.: 910,766

[22] Filed: Jul. 8, 1992

[30] Foreign Application Priority Data

Jul. 12, 1991 [JP] Japan .................. 3-172013

[51] Int. Cl.$^5$ ............................................. H01L 21/20
[52] U.S. Cl. ................................... 437/133; 437/108; 437/110; 148/DIG. 48; 148/DIG. 72; 156/613
[58] Field of Search ............... 437/133, 107, 108, 110, 437/81; 148/DIG. 25, DIG. 41, DIG. 48, DIG. 57, DIG. 72; 156/610, 613

[56] References Cited

U.S. PATENT DOCUMENTS

| | | | |
|---|---|---|---|
| 4,855,249 | 8/1989 | Akasaki et al. | 148/DIG. 25 |
| 4,859,625 | 8/1989 | Matsumoto | 437/133 |
| 4,885,260 | 12/1989 | Ban et al. | 437/133 |
| 5,082,798 | 1/1992 | Arimoto | 156/613 |

FOREIGN PATENT DOCUMENTS

| | | |
|---|---|---|
| 61-34922 | 2/1986 | Japan . |
| 63-239918 | 10/1988 | Japan . |
| 2-12814 | 1/1990 | Japan . |
| 2-302632 | 12/1990 | Japan . |

OTHER PUBLICATIONS

Aoyagi et al., "Atomic-Layer Growth of GaAs by Modulated-Continuous-Wang Laser MOVPE" J. Vac. Sci. Technol. B5(5) Sep./Oct. 1987 pp. 1460-1464.

Mori et al., "GaAs Growth by Atomic Layer Epitaxy Using Diethylgalliumchloride" Appl. Phys. Lett. vol. 52 No. 1 Jan. 1988 pp. 27-29.

Nishizawa et al., "Molecular Layer Epitaxy," J. Electro Chem. Soc. May 1985 1197-1200.

Briones et al., "Low-Temperature Growth of AlAs/GaAs heterostructures by Modulated MBE", Japanese Jol. of Applied Physics, vol. 26 No. 7, Jul. 1987, pp. L1125-L1127.

K. Mochizuki et al., "Carbon Incorporation in GaAs Layer Grown by Atomic Layer Epitaxy," Journal of Crystal Growth, vol. 93 (1988), pp. 557-561.

M. Ozeki et al., "New approach to the atomic layer epitaxy of GaAs using a fast gas stream," Applied Physics Letters, vol. 53, No. 16, Oct. 17, 1988, pp. 1509-1511.

Primary Examiner—Brian E. Hearn
Assistant Examiner—Kevin M. Picardat
Attorney, Agent, or Firm—Staas & Halsey

[57] ABSTRACT

A heterojunction between In-containing compound semiconductors in which the interface thereof is controlled at an atom level is provided by a process of atomic layer epitaxy (ALE) in which hydrogen gas is utilized as a carrier gas and as a purge gas for a separation of source gases. The time for which the purge gas is supplied can be utilized for controlling the ALE.

12 Claims, 14 Drawing Sheets

△ : In
□ : Ga ) III GROUP
◉ : As ) V GROUP

ATOMIC LAYER EPITAXY OF COMPOUND SEMICONDUCTOR

BACKGROUND OF THE INVENTION

1. Field of the Invention

The present invention relates to a process for growing a crystalline compound semiconductor. Compound semiconductors are used, for example, as materials for composing various electronic devices, and for a miniaturization and improvement of the performance of electronic devices, sometimes it is desirable to grow a compound semiconductor having a required composition to a required thickness at a required place. The atomic layer epitaxy (ALE) process for controlling the growth at an atomic layer level is one means of attaining the above requirements.

2. Description of the Related Art

Known methods of a gas phase deposition of a crystalline compound semiconductor include a metalorganic chemical vapor deposition (MOCVD), a molecular beam epitaxy (MBE), and an atomic layer epitaxy (ALE), etc. The MOCVD provides a high deposition rate, but in a MOCVD, it is difficult to control the atomic layer level. The MBE uses a super high vacuum apparatus, wherein a molecule beam is fed into a super high vacuum chamber to grow a crystal layer.

ALE is advantageous when a ternary element compound semiconductor is grown. In the conventional processes, the three elements occupy random sites in the crystal so that scattering of a carrier is caused by the alloy effect. In contrast the site of each element can be designed by ALE so that a crystal structure without the alloy scattering effect can be grown.

Japanese Unexamined Patent Publication (Kokai) No. 61-34922 discloses an ALE in which a vacuum chamber is evacuated to a super high vaccum, as substrate is heated, and gases containing constituent elements for a compound semiconductor to be grown are sequentially introduced in predetermined amounts into the vaccum chamber, to grow a compound molecular layer by molecular layer. This process, however, requires a long time for switching the source gas, during which the once-deposited atomic layer may be adversely affected, and thus the controllability thereof is low.

Also, the ALE has problems with hetero epitaxy.

First, an epitaxial growth of an InAs layer on an InAs substrate is described. In a reaction tube of quartz or the like, an InAs substrate is heated to, for example, 350° C., and a source gas for a III-group element, In, and a source gas for a V-group element, As, are alternately introduced over the substrate. The gas pressures are, for example, in a range of several torr to several 100 torr. An example of the In source is trimethylindium (CH$_3$)In, and an example of the Ga source is arsine AsH$_3$. An In layer and an As layer are alternately grown on the substrate, to thereby grow an InAs crystal by ALE.

Next, a GaAs crystal is grown, for example, at 500° C., from trimethylgallium (CH$_3$)Ga, as a Ga source and arsine AsH$_3$ as an As source.

In the above examples, the growth temperature of an InAs crystal is 350° C. and that of a GaAs crystal is 500° C. Accordingly, when a heterojunction of InAs/GaAs is grown, if the growth temperature is set to 500° C. it is too high for the InAs growth, and accordingly, the self-limiting effect is lost and an atomic layer growth becomes difficult. Further, if the growth temperature is set to 350° C. it is too low for the GaAs growth, and thus crystal growth does not proceed. If the growth temperature is frequently varied during the crystal growth, the controllability and efficiency thereof are deteriorated.

Moreover, problems arise such as the differences of lattice constants and thermal expansion coefficients of crystals constituting the heterojunction, the stability of the respective atoms at the heterojunction, and an interdiffusion of constituent atoms at the heterojunction, or the like.

Furthermore, in a conventional ALE, the growth rate by one cycle of source gas supply is determined by the concentrations and supply times of the source gases. Particularly, the growth rate in ALE is reported, for example, for GaAs in Applied Physics Letters, vol. 53, pp. 1509–1511 (1988). Also, the purity of a GaAs crystal depending on the concentrations and supply times of the III and V source gases is reported in Journal of Crystal Growth, vol. 93, p. 557 (1988). Thus, the effects of the time when a source gas is not supplied on the growth rate and the characteristics of the grown crystal are not known.

As above, the atomic layer epitaxy, particularly hetero-epitaxy of a compound semiconductor has not been clarified as yet, and it is still difficult to grow a crystal having required qualities by ALE.

SUMMARY OF THE INVENTION

Therefore, an object of the present invention is to provide a process for growing a crystalline compound semiconductor, in which a control of an atomic layer level is possible and an excellent crystalline compound semiconductor can be grown.

Another object of the present invention is to provide a process for growing a heterojunction of crystalline compound semiconductors containing indium as the III-group element in an atomic layer precision.

A further object of the present invention is to examine the effects of the time at which a source gas is not supplied to the crystal growth, and to improve the ALE technology and enable a control of the growth of a crystal at the atom level and provide an excellent hetero-epitaxy.

To attain the above and other objects of the present invention, the present invention provides a process for growing a crystalline compound semiconductor, comprising the steps of heating a crystalline substrate to a predetermined temperature in a vacuum chamber; and at said predetermined temperature of the crystalline substrate, in the following sequence; supplying a first source gas for a III-group element containing an organic In compound diluted with hydrogen over said crystalline substrate under a predetermined pressure, discharging the first source gas, supplying a second source gas for a first V-group element over said crystalline substrate under a predetermined pressure, discharging the second source gas, supplying a third source gas for a III-group element containing an organic In compound diluted with hydrogen over said crystalline substrate under a predetermined pressure, discharging the third source gas, supplying a forth source for a second V-group element over said crystalline substrate under a predetermined pressure, and discharging the forth source gas, wherein said first and second V-group elements have at least different compositions or even contains different elements. In the above process, the first to forth source gases are supplied oven the crystalline substrate without pyrolysis of the source gases.

In the above process, the steps of supplying the first and second source gases can be alternately repeated to grow a first compound semiconductor layer on the crystalline substrate, before the step of supplying the third source gas. Also, after the step of supplying the second source gas, the steps of supplying the third and fourth source gases can be alternately repeated to grow a second compound semiconductor layer, on said first compound semiconductor layer. Accordingly, a heterojunection is formed at the interface of the first and second compound semiconductor layers, and in accordance with the process of the present invention, this heterojunction has an excellent atomic layer level, or even atom level, and therefore, it is possible to produce a superlattice structure in which various compound semiconductor layers are sequentially and repeatedly grown and all of the interfaces of the layers are sharp or precise. It is also possible for each layer to have a thickness of not more than 20 molecular layers, i.e., a very fine superlattice structure.

Typically, heterojunction such as InAs/InP, InAsP/InP, InAs/InAsP can be grown.

The first and third source gases are supplied over the crystalline substrate under the conditions of a predetermined temperature, a rate of hydrogen dilution of the organic In compound, a flow rate of the source gas and a predetermined pressure such that the organic In compound is not effectively pyrolized before reaching the crystalline substrate, but is pyrolized on reaching the crystalline substrate.

Also, preferably a hydrogen gas is supplied after the step of supplying each source gas, to purge away the source gas, but the time for which the $H_2$ is supplied for the purge, after the supply of a V-group source gas, is limited within a certain range such that the already adsorbed V-group atoms are not removed.

In another aspect of the present invention, there is provided a process for growing a crystalline compound semiconductor, comprising the steps of supplying a III-group element source gas over a crystalline substrate, supplying a hydrogen gas over the crystalline substrate to purge away the III-group element source gas for a predetermined time, supplying a V-group element source gas over the crystalline substrate, and supplying a hydrogen gas over the crystalline substrate to purge away the V-group element source gas for a predetermined time, and repeating said steps to thereby grow a III-V compound semiconductor layer on the crystalline substrate, wherein said time of supplying the hydrogen gas for said purge is controlled, to thereby control a growth rate of said compound semiconductor.

Also, there is provided a process for growing a crystalline compound semiconductor, comprising the steps of supplying a III-group element source gas over a crystalline substrate, supplying a hydrogen gas over the crystalline substrate to purge away the III-group element source gas for a predetermined time, supplying supplying a V-group element source gas over the crystalline substrate, supplying a hydrogen gas over the crystalline substrate to purge away the V-group source gas, and supplying a dopant source over the crystalline substrate, and repeating the above steps to thereby grow a doped III-V compound semiconductor layer on the crystalline substrate for a predetermined time, wherein said time of supplying the hydrogen gas is controlled to thereby control a concentration of said dopant in said doped-III-V compound semiconductor layer.

In a third aspect of the present invention, there is provided a semiconductor device comprising a structure of alternate first and second III-V compound semiconductor layers, said first and second III-V compound semiconductor layers containing indium as a constituent element having a different composition or constituent element, said first and second III-V compound semiconductor layers having a thickness of not more than 20 molecules of the III-V compound semiconductor thereof.

DESCRIPTION OF THE PREFERRED EMBODIMENTS

Figure 1:
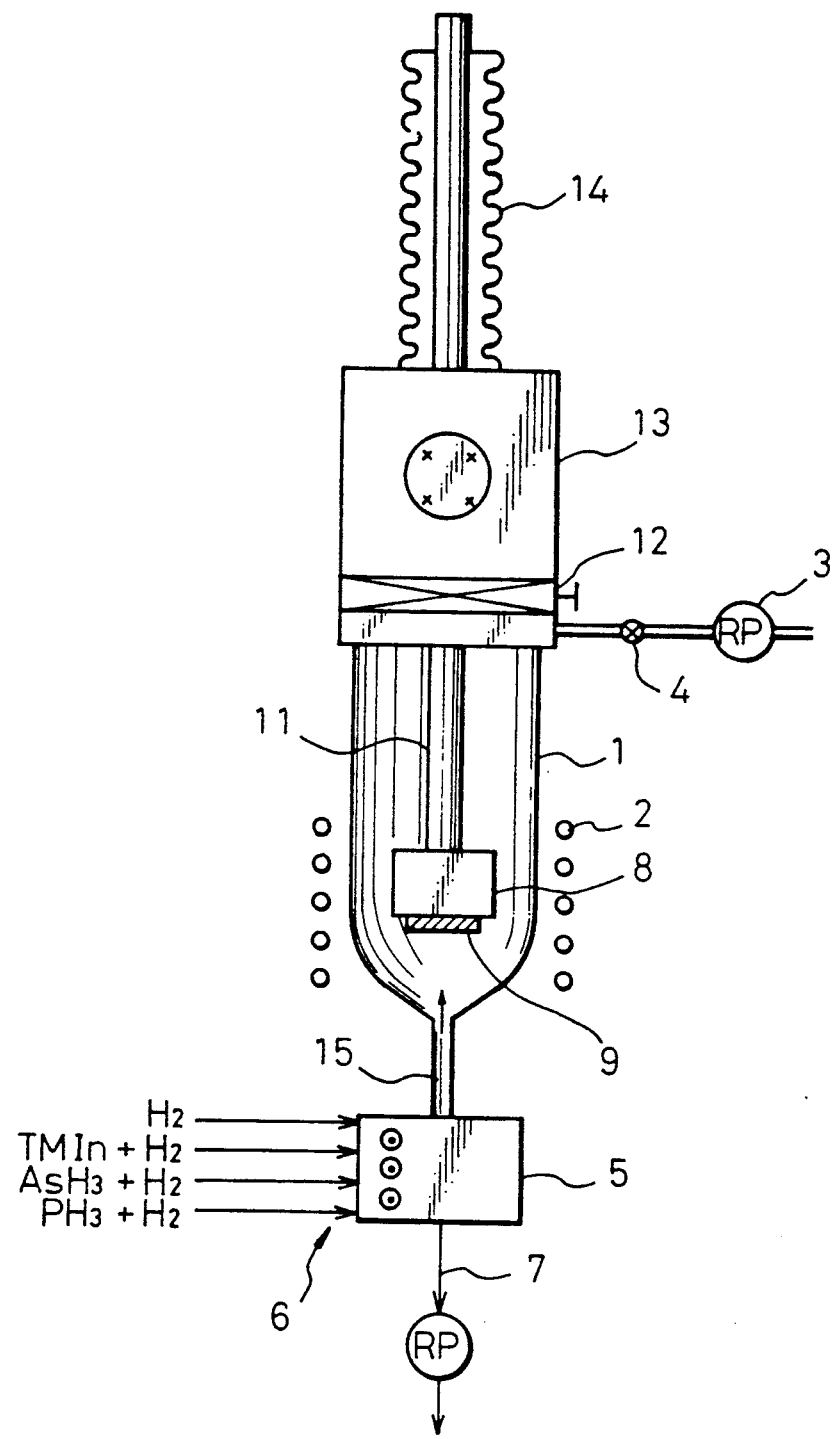
FIG. 1 schematically shows an apparatus for atomic layer epitaxy in Examples.

Since InAs has a high electron mobility, lattice mismatched type and heterojunction type devices utilizing InAs are extremely useful, but it has not been easy to form such a heterojunction. For example, even in a GaAs/InGaAs system, the composition of In in InGaAs is at most only about 0.2 (20 mole % of InGaAs). Accordingly, the present inventor carefully studied a system of a heterojunction containing indium in both sides, which includes systems having a small lattice mismatch and makes the growth of the heterojunction easier. Particularly, InP/InAs is advantageous since the interdiffusion of As and P at the interface of InP and InAs is extremely small. It is advantageously noted that In-containing compound semiconductors include combinations thereof which have close growth temperature ranges in ALE.

Second, a III-group source gas comprising an organic In compound diluted with hydrogen is used under a predetermined pressure, and this enables a growth of a mono atomic layer of indium on a crystalline substrate. Further, the reaction of the source gas can be controlled by setting a temperature of the crystalline substrate. Particularly, it is possible to control the reaction such that the organic In compound is not pyrolized until it reaches the substrate, i.e., is pyrolized on the substrate. This control is made possible by using a source gas of an organic In compound diluted with hydrogen. Thus, the combination of the utilization of a hydrogen-diluted organic In compound and the control of the substrate temperature makes a two-dimensional growth of In or an In-containing III-group elements possible. If the substrate temperature is too high, a three-dimensional deposition occurs.

If the deposition of a mono layer of a III-group element is obtained, it is easy to obtain a mono layer of a V-group element in ALE technology, and accordingly, the precise growth of a mono layer of a III-V compound semiconductor is made possible.

Third, a separation between a III-group source gas and a V-group source gas can be improved by supplying a hydrogen gas, for purging, between the steps of supplying the III-group and V-group gases. By utilizing a hydrogen gas for purging, the separation of the different source gases is made more complete in a shorter time, and this prevents damage to the once formed complete interface during the gas separation period which occurs in the gas separation by the super high vacuum, as taught in Japanese Unexamined Patent Publication (Kokai) No. 61-34922.

Since the utilization of a hydrogen diluted source gas contributes to a precise growth of an atomic layer, and since the utilization of a hydrogen gas for purging or source gas separation prevents damage to the already grown layer, the process of the present invention widens the ranges of controllable conditions for obtaining a desirable heterojunction of various compound semiconductors. Thus, the growth of an excellent heterojunection of, for example, InAs/InP by ALE is made possible by the present invention.

Note, if the hydrogen gas is supplied for more than a certain time, for the purging or gas separation after the step of supplying a V-group element source gas, the already deposited V-group element tends to be desorped or reevaporated. If the already deposited V-group element is desorped, another V-group element may then deposit there so that allowing disadvantageously occurs. Accordingly, the purging should be kept within the certain time needed for obtaining an excellent crystal or heterojunction. Nevertheless, the amounts of vacancies, dopants, etc., in the compound semiconductor can be controlled by controlling the purge time, since the amount of the V-group element desorped by the purge depends on the purge time.

Figure 2:
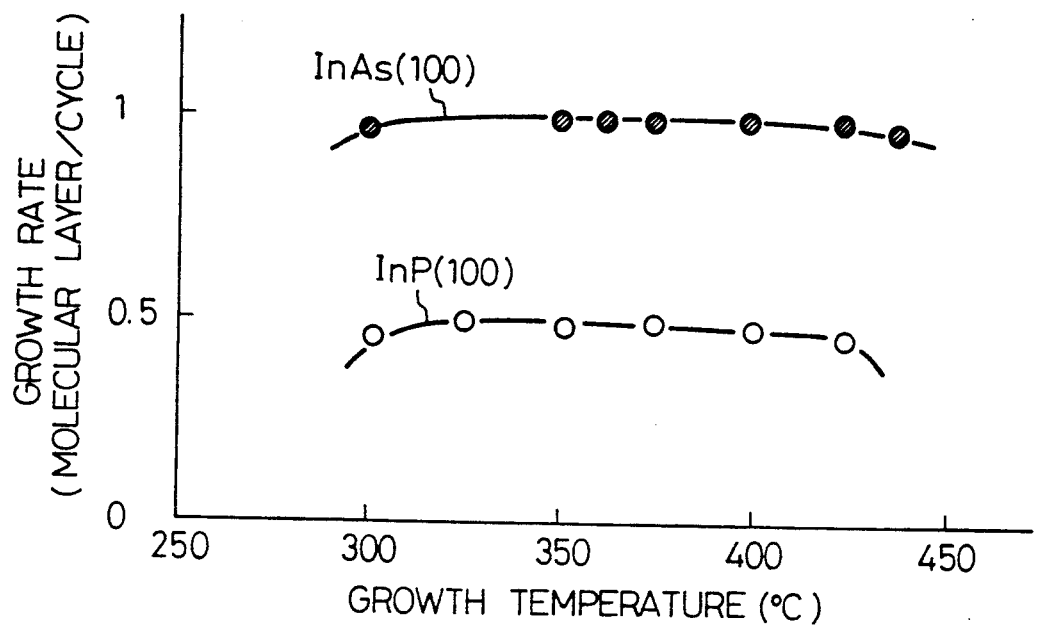
FIG. 2 shows the dependency of the crystal growth on the growth temperature in ALE of InAs and InP.

1. The basic experimental results of the present invention are first described. FIG. 1 schematically shows an apparatus for carrying out the crystal growth process of the present invention, and FIG. 2 shows the dependency of the crystal growth rate on the growth temperature.

In FIG. 1, a reaction tube 1 is made of quartz, has a narrowed end, and can be evacuated. A susceptor 8 for mounting a crystalline substrate thereon is arranged in the reaction tube 1. The susceptor 8 is made of, for example, carbon (graphite), able to absorb a radio frequency. The susceptor 8 is supported by a support bar 11 and is movable between a preparation chamber 13 and a crystal growth chamber, through a gate valve 12.

Bellows 14 are provided to maintain an airtight condition while vertically moving the support bar 11. An RF coil 2 is arranged around the reaction tube 1 at the portion at which the crystal growth is carried out, and the carbon susceptor 8 can be heated by RF.

The lower portion of the reaction tube 1 is connected to a gas inlet 15 having a small diameter, to thus increase the speed of a gas stream or jet. The gas inlet 15 is connected to a manifold 5, for selecting a gas from among a plurality of gases. The gas inlet portion 6 of the manifold 5 is connected to a plurality of gas pipes. The manifold 5 also has a vent pipe 7 through which supplied gases can escape without being supplied to the reaction tube 1.

Connected to the upper portion of the reaction tube 1 are a valve 4 for regulating a pressure and a vacuum unit 3 for evacuating the used gas.

In this apparatus, it is possible to heat the crystalline substrate to a predetermined temperature, to supply a desired source gas over the substrate at a desired flow rate under a desired pressure, and to exchange one gas for another gas in a desired short time.

The heating means may be an electrical resistance heating, lamp heating or any other heating means, and the reaction tube 1 may be made a material of other than quartz. The susceptor 8 may be any such element capable of holding the substrate at a predetermined temperature. The manifold 5 should be able to exchange on gas charged in the reaction tube for another gas in about 10 seconds.

Using an apparatus as shown in FIG. 1, a crystal growth was carried out to grow InAs on a (1 0 0) plane InAs substrate and InP on a (1 0 0) plane InP substrate. The growth conditions were as follows.

The In source was trimethylindium (TMIn), the As source was arsine ($AsH_3$), and the P source was phosphine ($PH_3$). The In source gas was obtained by passing hydrogen gas through TMIn in a container kept at 27.1° C., and was supplied into the reaction tube 1 together with hydrogen at 60 sccm for 15 seconds. The concentration of TMIn was about $5 \times 10^{-3}\%$ in the reactor and 0.17% in the TMIn container.

$AsH_3$ was diluted with hydrogen to about 10%, and supplied at 480 sccm for 10 seconds. $PH_3$ was diluted with hydrogen to about 20%, and supplied at 480 sccm for about 20 seconds. The pressure in the reaction tube 1 was kept at about 15 torr during the crystal growth. The total gas flow in tube was 2000 sccm. The gas supply was carried out in the order of the III-group element source, hydrogen, the V-group element source and hydrogen, and this cycle was repeated. The hydrogen was supplied as a purging gas, to prevent a mixing of the III-group and V-group element sources in the reaction tube 1.

FIG. 2 shows the results of the obtained growth rate in relation to the growth temperature. One cycle of gas supply involves one supply of the III-group element source and one supply of the V-group element source, and the growth rate is expressed by the number of molecular layers grown per cycle.

FIG. 2 clearly demonstrates that one molecular layer of InAs was grown in one cycle in a temperature range of about 350° to 450° C., preferably about 310 to 450° C., and half of a molecular layer of InP was grown in one cycle in a temperature range of about 300° to 450° C., preferably 310° to 425° C. It is a characteristic of InP that a half molecular layer is grown in one cycle, and thus two cycles are necessary when growing one molecular layer of InP.

Accordingly, the temperature ranges in which InAs and InP can be stably grown under a precise control almost overlap each other, and thus InAs and InP layers can be grown on a crystalline substrate kept at a certain temperature to thereby form an excellent heterojunction.

2. (1) Next, using the apparatus as shown in FIG. 1, an $(InAs)_m(InP)_n$ superlattice structure was grown on a (1 0 0) plane InAs substrate. $(InAs)_m(InP)_n$ denotes that the superlattice structure is formed by the repeating unit layers of m molecular layers of InAs and n molecular layers of InP.

The growth temperature was kept constant at 365° C. and the pressure was kept constant at 15 torr, during the crystal growth.

The In source was TMIn diluted with hydrogen to about 0.17%; the As source was $AsH_3$ diluted with hydrogen to about 10%, and the P source was $PH_3$ diluted with hydrogen to about 20%. The flow rates of the In source, As source, and P source were 60 sccm, 250 sccm, and 400 sccm, respectively. Hydrogen gas was further added as a carrier gas, to make the total gas flow rate in the reaction tube 1 to 2000 sccm.

Before the formation of the superlattice structure, InAs and InP layers were grown to determine the time needed for supplying the In source.

Figure 3:
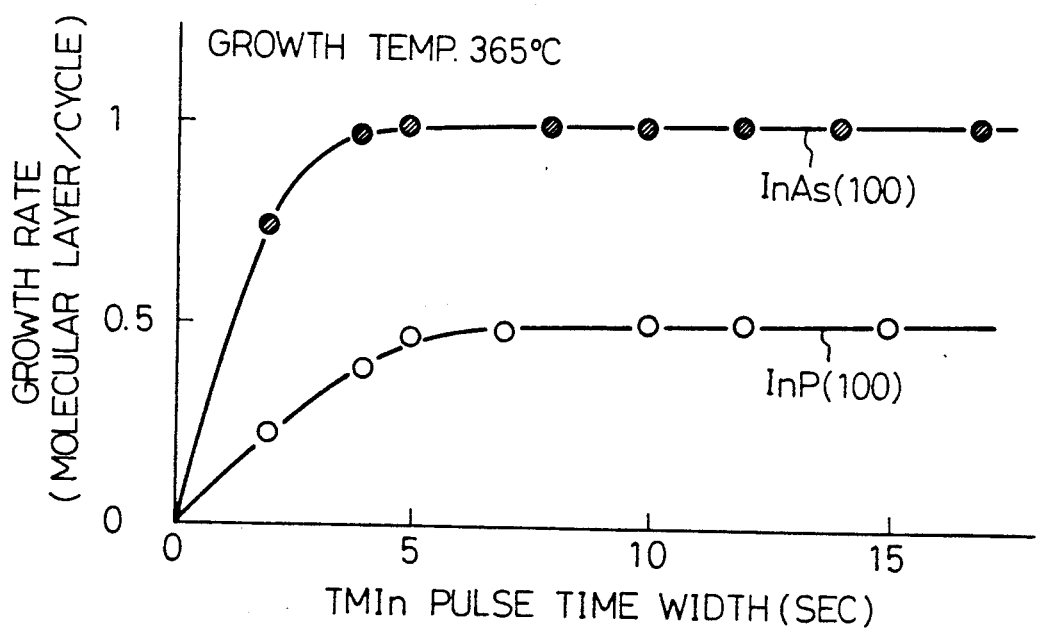
FIG. 3 shows the dependency of the growth rate to the time width of TMIn supply in ALE using TMIn as an In source.

FIG. 3 shows the dependency of the growth rates of InAs and InP on the pulse time width of the In source (TMIn) supply. It was found that a TMIn supply of at least about 4 seconds is sufficient to grow a complete molecular layer of InAs. Also, a TMIn supply of at least about 7 seconds is sufficient to grow a complete half molecular layer of InP, and two gas supply cycles provide a complete molecular layer of InP.

It is clearly demonstrated in FIG. 3 that the time of the TMIn supply over a certain term gives a single or half molecular layer, and the crystal growth does not progress, even if the time is prolonged, i.e., a self-limiting effect is observed.

Therefore, the TMIn supply time was set to 12 seconds.

(2) Using the conditions mentioned above, several superlattice structures $(InAs)_m(InP)_n$, where n and m are integers of more than zero, were grown.

Figure 4:
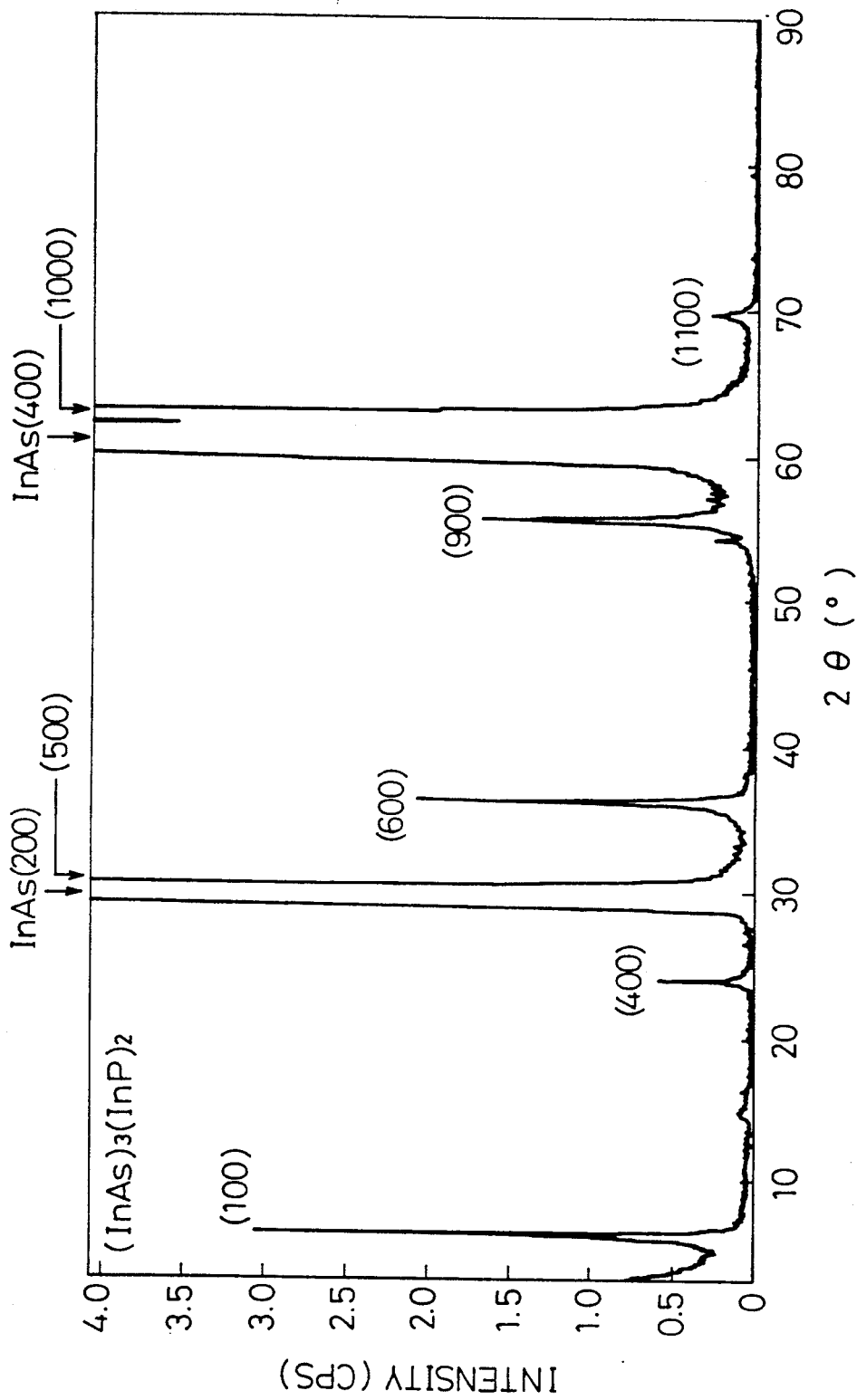
FIG. 4 shows X-ray diffraction peaks of (InAs)$_3$(InP)$_2$ superlattice structure made on an InAs substrate.

FIG. 4 is an X-ray diffraction pattern of $(InAs)_3(InP)_2$. The peaks (1 0 0), (4 0 0), (6 0 0), (9 0 0) and (11 0 0) are satellite peaks and indicate that a good single molecular layer growth occurred. The peaks (5 0 0) and (10 0 0) are diffraction peaks from the five molecular layers as a unit, and include peaks (2 0 0) and (4 0 0) of InAs of the substrate.

Thus, the X-ray diffraction peaks of FIG. 4 demonstrate that the superlattice structure of $(InAs)_3(InP)_2$ was made on the (1 0 0) plane of the InAs substrate.

Figure 5:
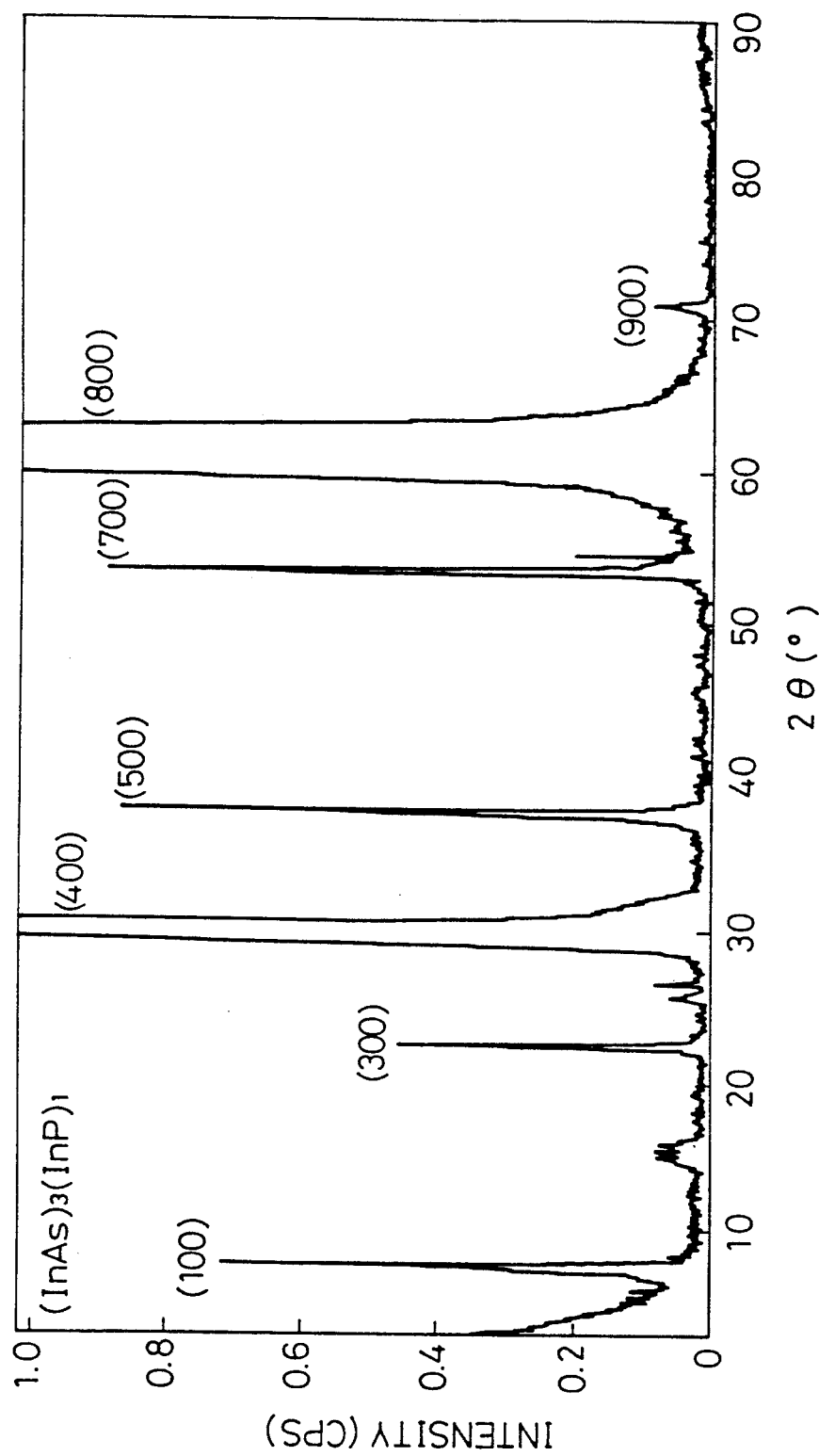
FIG. 5 shows X-ray diffraction peaks of (InAs)$_2$(InP)$_1$ superlattice structure made on an InAs substrate.

(3) FIG. 5 shows an X-ray diffraction pattern of a superlattice structure $(InAs)_3(InP)_1$ made in the same manner as above. In this case, four molecular layers are the repeating unit and (4 0 0) and (8 0 0) peaks are derived from this repeating unit. The peaks (1 0 0), (3 0 0), (5 0 0), (7 0 0) and (9 0 0) are satellite peaks derived from the single molecular layer structure.

Figure 6:
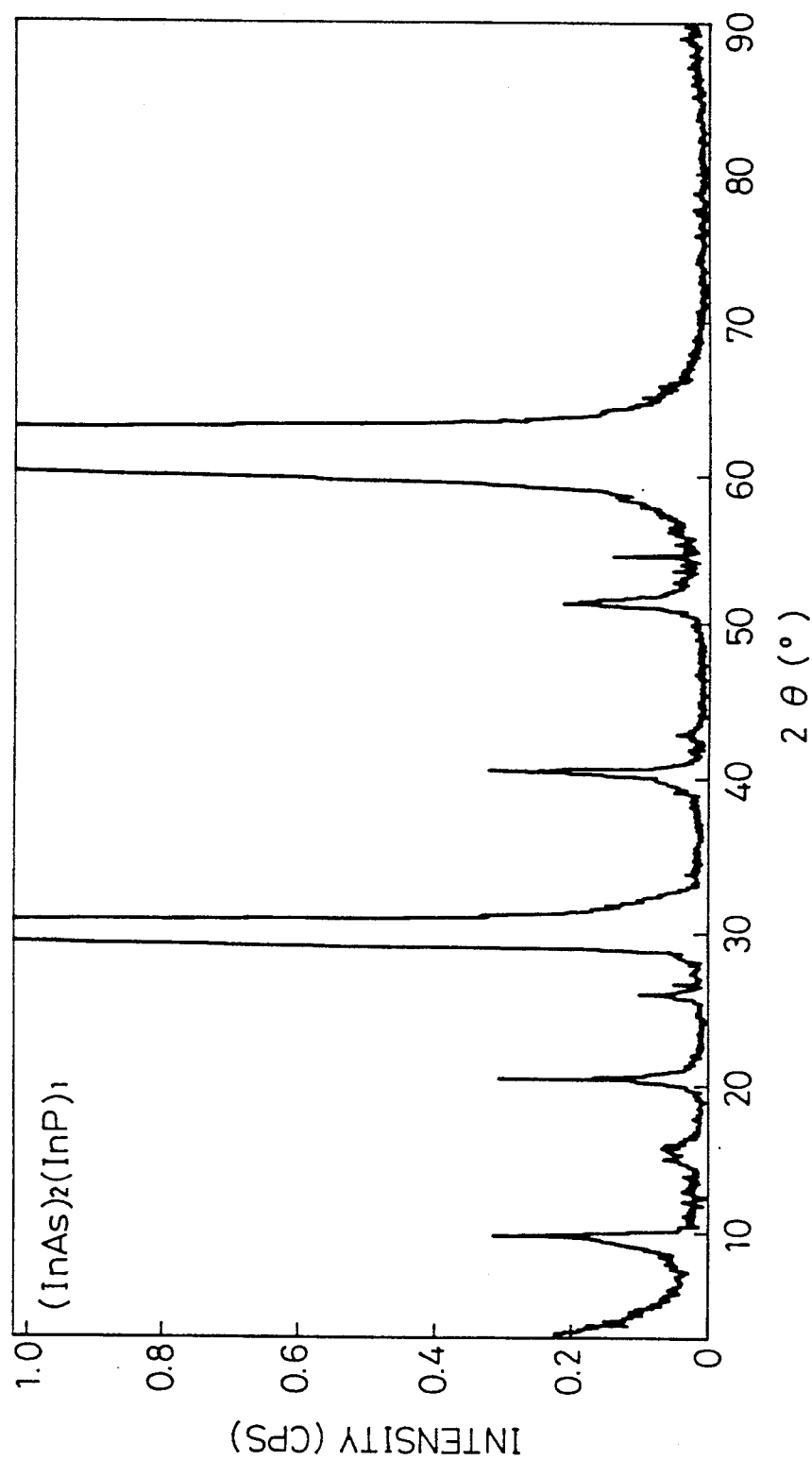
FIG. 6 shows X-ray diffraction peaks of (InAs)$_2$(InP)$_1$ superlatice structure made on an InAs substrate.

(4) FIG. 6 shows an X-ray diffraction pattern of a superlattice structure $(InAs)_2(InP)_1$ made in the same manner as above. In this pattern, satellite peaks derived from the single molecular layer structure are observed.

The X-ray peaks shown in FIGS. 4 to 6 were obtained from the grown layer having a thickness of about 100 nm. It was confirmed from these figures that the superlattice structures as designed were made.

(5) In the above experiments, it is important to use TMIn, a III-group element source, with hydrogen as a carrier gas. Although the present invention is not bound to this theory, the growth occurs in the following mechanism, in accordance with the analysis of the data of the above and other experiments.

TMIn, a III-group element source, is little pyrolized before reaching the crystalline substrate and being adsorbed on the crystalline substrate in the form of the molecule. To pyrolize TMIn, hydrogen is needed, and thus methyl is converted to methane. The hydrogen of the carrier gas supplies this hydrogen to react with methyl.

Figure 7:
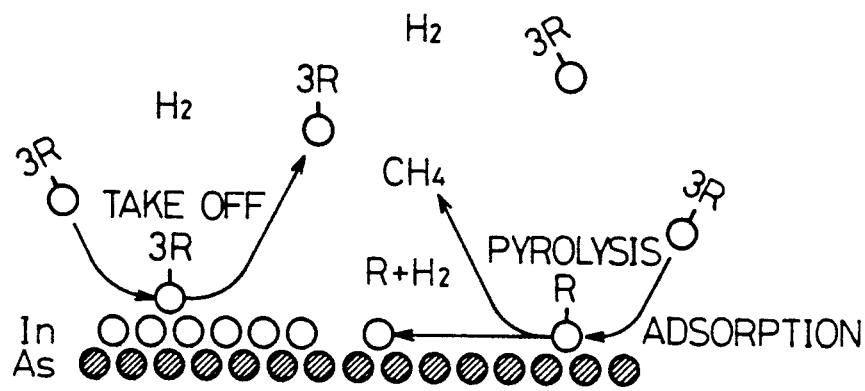
FIG. 7 shows the mechanism of crystal growth.

FIG. 7 shows this reaction, wherein R stands for methyl and the white circle stands for indium.

When a trimethyl indium (TMIn) molecule is adsorbed on the As atomic layer, as shown in the right half of FIG. 7, little of the TMIn molecule desorbed, and it easily reacts with hydrogen to leave an In atom on the As atomic layer, and the methyl escapes in the form of methane into the gas atmosphere.

When the TMIn molecule is adsorbed on the surface of the In atoms already adsorped as shown in the left half of FIG. 7, the adsorption energy is so low that the adsorbed In atom is desorbed into the atmosphere. To ensure this, it is important that the temperature of the substrate is not too high.

The In atom adsorped by pyrolysis of a TMIn molecule on the substrate migrates on the surface of the substrate to be stabilized where the In atoms aggregate or come in contact. Thus, the In atom layer expands to form the two-dimensional growth.

If the TMIn molecules collide and react with each other in the atmosphere or on the substrate to form In atoms, the desired growth mechanism is disturbed. Therefore, the substrate temperature or growth temperature, the dilution rate of TMIn by hydrogen, the time that TMIn reaches to the crystalline substrate from the source, i.e., the flow rate of the supply gas if the reaction chamber is fixed, and the frequency of the collision of the TMIn molecules in the atmosphere, i.e., the pressure of the supply gas, and the like, are the parameters for the control of the considered reaction mechanism.

It is preferable to control the above parameters such that TMIn is little pyrolized in the atmosphere before reaching the substrate, is adsorbed in the form of a molecule on the substrate, and is pyrolized by hydrogen to become an In atom, and form an In atom layer.

It is noted that the atomic layer deposition of a V-group element is easy in comparison with that of a III-group element, and the self-limiting effect of the growth of the V-group element is higher. Therefore, hydrogen as a carrier gas is not essential, but is of course preferred, to ensure the atomic layer growth of the V-group element and to accelerate the total process of the ALE.

The source gas may be, for example, molecules of III-group and V-group elements bonded with any of hydrogen, methyl, ethyl, isobutyl, tertiarybutyl, amino, and some halogens. For example, arsine, phosphine, tertiarybuthyl arsine, tertiarybuthyl phosphine, monoethyl arsine, monoethyl phosphine, etc. The V-group element may be not only As and P but also other V-group elements such as Sb. Sb allows a control of the lattice constant mismatch.

It is also preferred to keep the pressures of the supply gases constant, to prevent a reverse gas flow when one gas is exchanged for another gas.

The growth of an InP molecule layer requires two successive gas supply cycles, since one cycle gives only a half of an InP molecule layer.

3. (1) The principle of control of the crystal growth of a compound semiconductor by a control of the hydrogen purge after the V-group source gas supply is first described with reference to FIGS. 8A to 8D, followed by experimental examples.

FIGS. 8A to 8D show the homogeneous growth of GaAs from trimethyl gallium (TMGa) and arsine ($AsH_3$) in hydrogen gas flows.

Figure 8B:
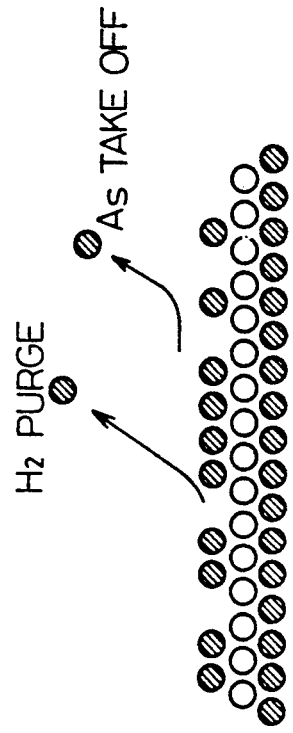
FIGS. 8A to 8D show the principle of control of the crystal growth by $H_2$ purge.
Figure 8D:
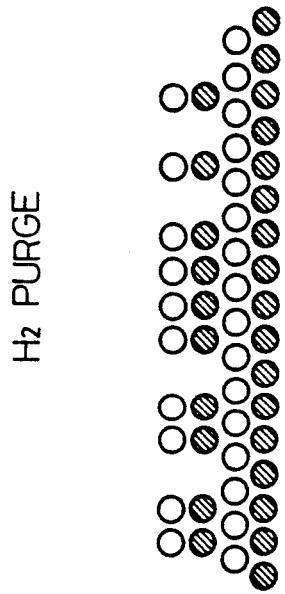
Figure 8A:
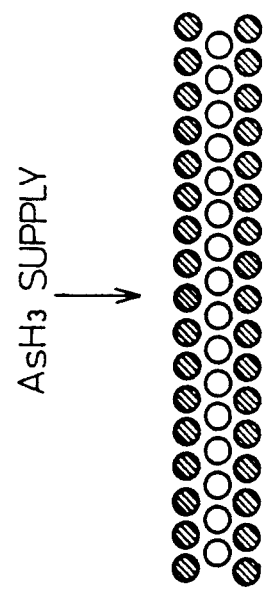

FIG. 8A shows $AsH_3$ as an As source being supplied on a crystalline substrate. $AsH_3$ is pyrolized by the catalytic action of the crystal surface of the substrate to become an As atom or molecule and deposit one atomic layer on the crystal surface. Since As has a high vapor pressure or a small bond energy of As-As, more than one atomic layer are not adsorped.

Referring to FIG. 8B, the $AsH_3$ supply is stopped and only hydrogen gas is supplied to purge away the $AsH_3$ molecule. During this purge by $H_2$, As atoms are desorped the GaAs surface and the number of the remaining As atoms depends on the time of $H_2$ purge and the substrate temperature.

Figure 8C:
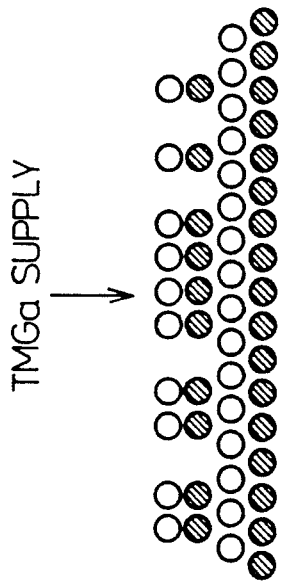

When TMGa is supplied, the TMGa molecules react selectively with the As atoms on the surface of the substrate, to adsorp Ga atoms thereon (FIG. 8C).

Then, TMGa is purged away by hydrogen gas (FIG. 8D). Nevertheless, as shown later in the experiments, the Ga atoms on the surface of the substrate are not desorped by supplying hydrogen there.

Accordingly, the amount or rate of the crystal growth after the cycle ($AsH_3 \rightarrow H_2 \rightarrow TMGa \rightarrow H_2$) of FIGS. 8A to 8C is determined by the amount of As atoms remaining on the surface of the substrate after a take off thereof.

In a homogeneous growth of a compound semiconductor, particularly a binary compound semiconductor, the effect of the desorption of the V-group element by the hydrogen purging step causes only a variation of the growth rate of the compound semiconductor. In a heterogeneous growth, however, the desorption of a V-group element affects the precision of the heterojunction and alloying layers appear at the interface of the hetero compound semiconductors. The alloy layer may cause scattering, and accordingly, the desorption of the V-group element must be prevented to thereby obtain a perfect atomic layer heterojunction.

Nevertheless, by controlling the vacancy sites of a V-group element, for example, if a dopant of a VII-group element is supplied to occupy the vacancy site and become a donor, the amount of doping or the efficiency of the dopant can be controlled. Similarly, if it is considered that the stoichiometry is changed on the surface of the substrate, the control of other impurities (donor, acceptor) to be incorporated or a point defect density, etc., is possible.

(2) The above principle was applied to ALE of InAs.

An apparatus as shown in FIG. 1 was used. The source gases were TMIn and $AsH_3$ diluted with $H_2$ and supplied onto an InAs crystalline substrate. The pressure in the reaction tube was kept at 15 torr and the total gas flow rate was 2000 cc/min during the growth. $H_2$ was passed through a cylinder containing TMIn kept at 27° C. at 60 cc/min. $AsH_3$ diluted with $H_2$ to 10% was supplied at 480 cc/min.

Figure 9A:
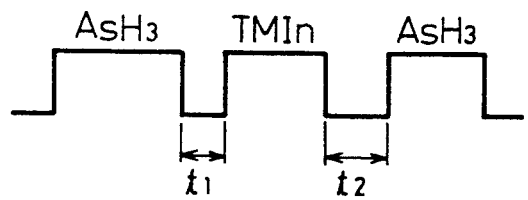
FIGS. 9A and 9B show sequential charts of ALE of InAs.

FIG. 9A shows the sequential chart of the gas supply. In FIG. 9A, $t_1$ denotes the time of $H_2$ purge after $AsH_3$ supply, and $t_2$ denotes the time of $H_2$ purge after TMIn purge. The exchange of the TMIn and $AsH_3$ was performed by the high speed switchable valve of the manifold.

Figure 10:
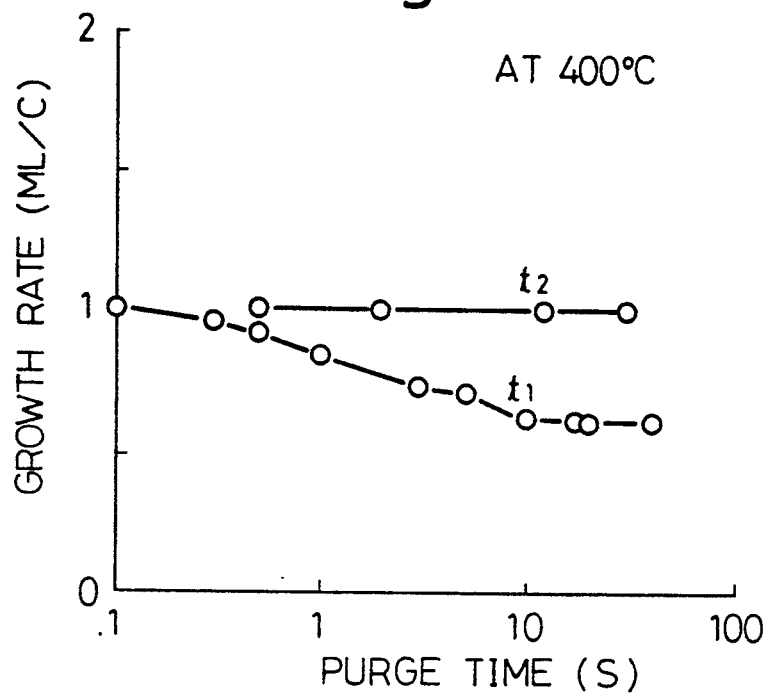
FIGS. 10 and 11 show the dependency of the crystal growth of InAs on the purge time.

To determine the resorption of already deposited atoms, the growth rate per one cycle of gas supply was measured while varying $t_1$ and $t_2$. FIG. 10 shows the growth rates in relation to $t_1$ and $t_2$ at a growth temperature of 400° C. In these experiments, the TMIn supply was 5 seconds and the $AsH_3$ supply was 10 seconds, in one cycle. One of $t_1$ and $t_2$ was always fixed to 0.5 second.

FIG. 10 demonstrates that the growth rate per cycle decreases with an increase of the $H_2$ purge time after the $AsH_3$ supply, and is not altered by an increase of the $H_2$ purge time after the TMIn supply.

Figure 11:
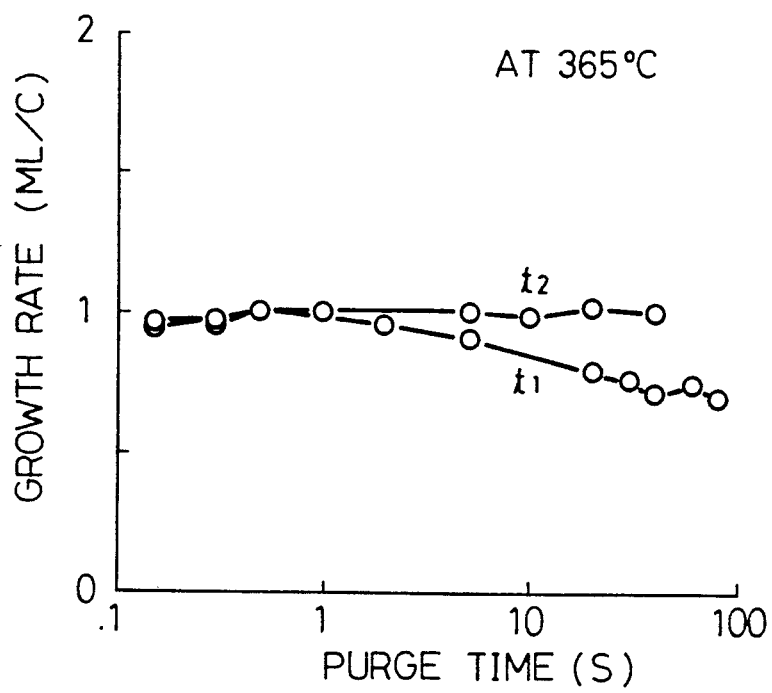

Similar results are observed at a growth temperature of 365° C. (see FIG. 11). It is noted, however, that the amount of desorption of As during the same $t_1$ is higher at a higher growth temperature than at a lower growth temperature.

Figure 12:
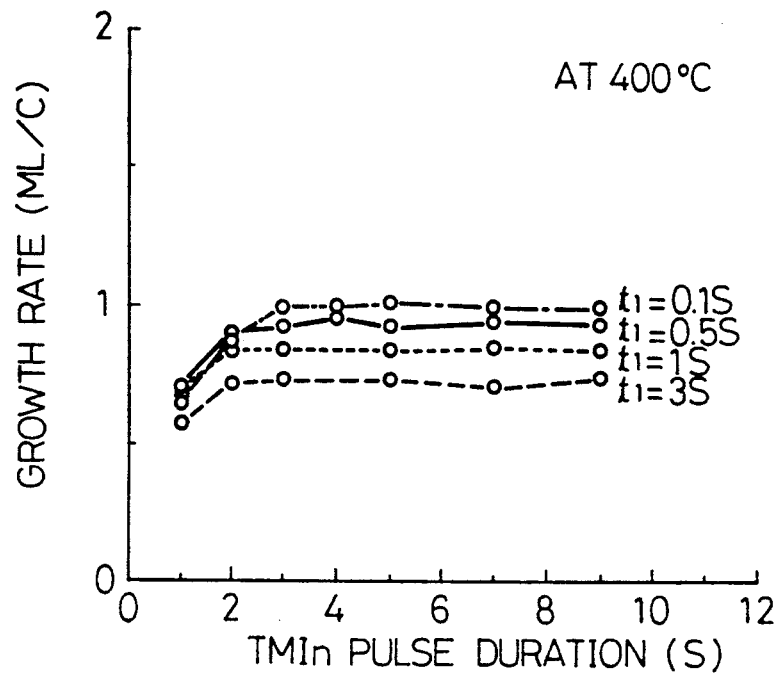
FIG. 12 shows the crystal growth v.s. TMIn supply time, with $t_1$ of FIGS. 10 and 11 as a parameter.

FIG. 12 shows the growth rate of InAs v.s. the pulse time of the TMIn supply, with $t_1$ as a parameter, in an ALE at 400° C. It is seen that the growth rate of InAs by ALE is controlled by $t_1$, i.e., the pulse time of the purge after the $AsH_3$ supply.

Figure 9B:
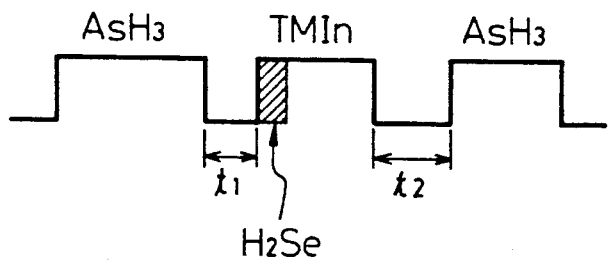

(3) In the same manner as above, and in the gas supply sequence as shown in FIG. 9B, $H_2Se$ was supplied after the $H_2$ purge step ($t_1$) after $AsH_3$ supply, to determine the doped amount. $H_2Se$ diluted with $H_2$ to 10 ppm was supplied at 30 cc/min for 1 second.

Figure 13:
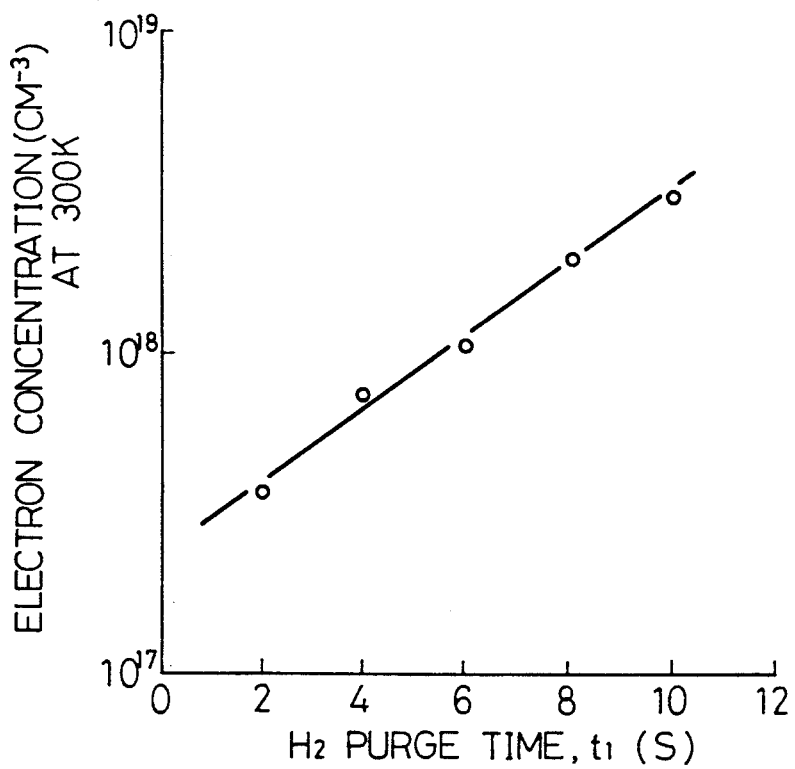
FIG. 13 shows the electron density or Se concentration v.s. $t_1$ ($H_2$ purge time after V-group source supply)

FIG. 13 shows the electron concentration (Se concentration) of the obtained crystal v.s. $t_1$. It is demonstrated that the electron concentration (Se conc.) increases along with an increase of $t_1$.

Generally, the dopant gas is supplied alone or in combination with a III-group element source, after the $H_2$ purge following the V-group element source supply, although it is not limited thereto.

Figure 14:
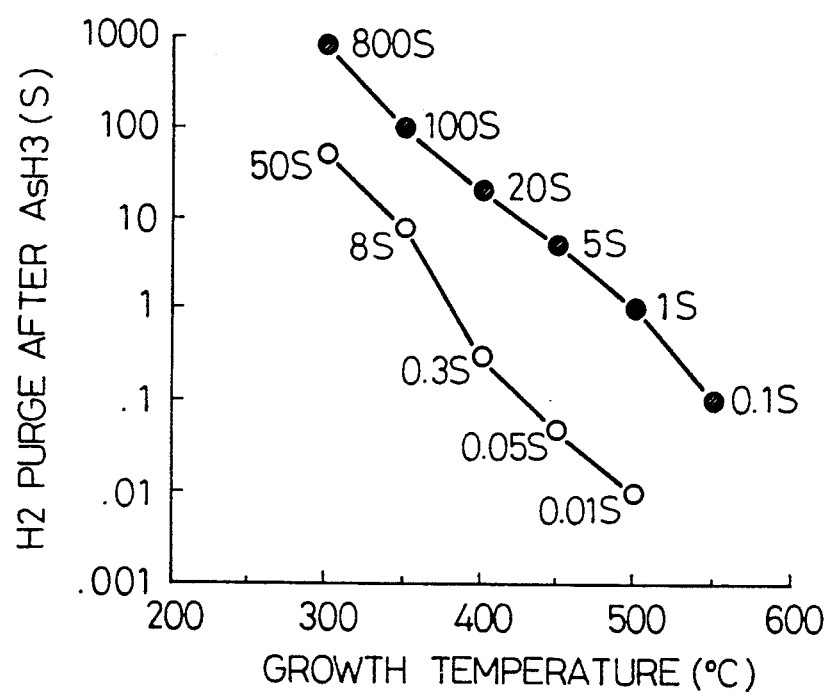
FIG. 14 shows the maximum $H_2$ purge time for preventing As desorption dependent on the growth temperature.

(4) FIG. 14 shows the limit of the time of the $H_2$ purge after an As source supply for preventing a desorption of the already deposited $As$, in relation to the growth temperature. The conditions of the process were the same as those for FIG. 2.

In FIG. 14, the hatched circles indicate the upper limit of the purging time for preventing the As resorption and the white circles indicate the practically adequate purging time. Accordingly, the preferable time limit of the pulse time t of $H_2$ purge can be expressed by the formula (1), more preferably by the formula (2).

$$\log t \leq -(7.09/475)T + 7.33 \ldots (1)$$

$$\log t \leq -(6.72/350)T + 7.44 \ldots (2)$$

wherein t stands for the $H_2$ purge pulse time after the As source supply, in seconds, and T stands for the growth temperature in ° C.

Figure 15:
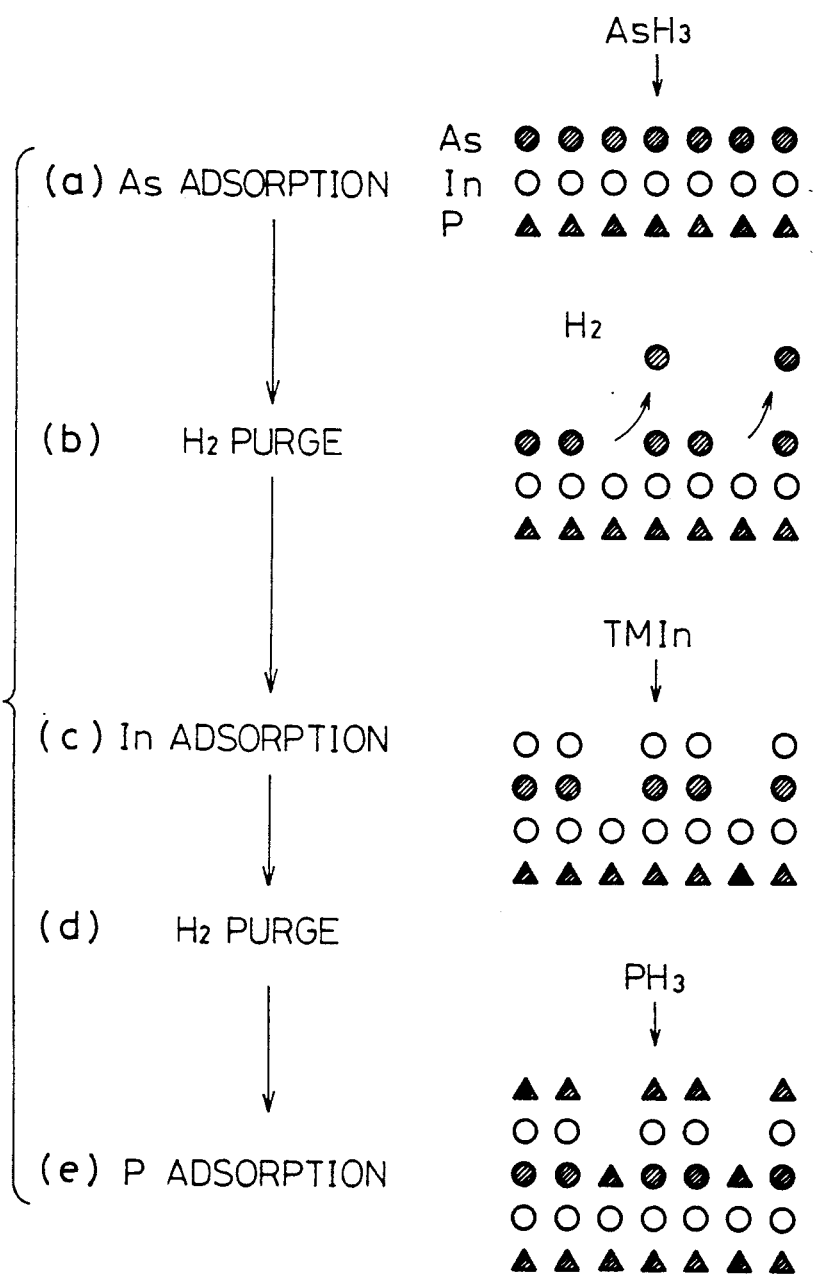
FIG. 15 shows the As adsorption by a long $H_2$ purge and an allowing caused thereby.

FIG. 15A illustrates the growth of InPAs, as an example, when the $H_2$ purging time is disadvantageously long. By ALE, P to In to As are grown and if the next $H_2$ purge time is too long, some of already adsorbed As atoms are desorped. When TMIn is then supplied thereover, In atoms are adsorbed only on the remaining As atoms and not on the already adsorbed In atoms. The next $H_2$ purge does not affect the In atoms. When $PH_3$ is then supplied, P atoms are adsorbed not only on the top In atoms that were adsorbed in the latest step but also on the In atoms on which In atoms were once adsorpted and then desorped. Thus, on the identical In atom layer, a layer of a mixture of As and P is formed and therefore the alloy structure is finally formed.

Figure 16A:
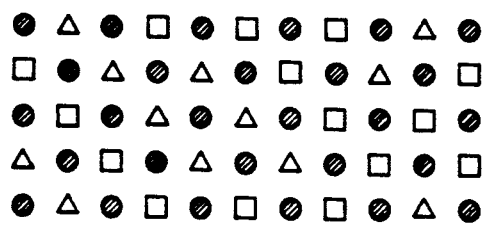
FIGS. 16A and 16B show the crystal structures of ternary compound semiconductor grown in the conventional deposition processes and by the ALE process of the present invention.
Figure 16B:
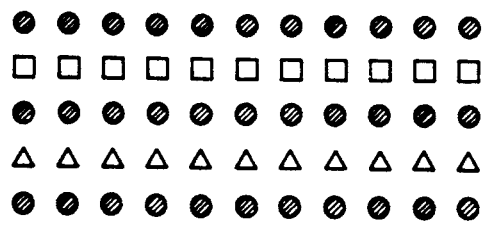

FIG. 16A shows the crystal structure of a typical compound semiconductor In GaAs, as an example, grown by the conventional deposition methods. In FIG. 16A, the sites of In, Ga and As atoms are random. FIG. 16B shows the crystal structure of a compound semiconductor InGaAs, as an example, grown by the ALE process of the present invention. In FIG. 16B, the sites of In, Ga and As atoms are in the order of layers and therefore this structure does not cause the carrier scattering by the alloy structure.

4. Examples of electronic devices in which the process of the present invention can be applied are illustrated.

Figure 17:
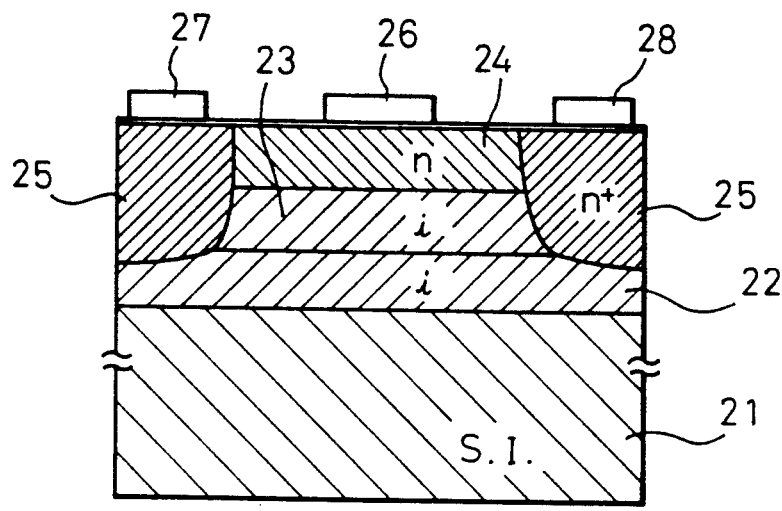
FIGS. 17 and 18 show a section of an HEMT and a bandgap thereof.

(1) FIG. 17 shows a high electron mobility transistor (HEMT) in which a non-doped superlattice structure 23 is utilized as an electron channel. In FIG. 17, 21 denotes an Fe-doped semi-insulating InP (1 0 0) substrate, 22 a non-doped InP buffer layer, 23 a non-doped $(InAs)_m(InP)_n$ superlattic structure as an electron channel, 24 a n-type InP, 25 n$^+$-type contact layers, 26 a gate electrode, 27 a source electrode, and 28 a collector electrode.

Figure 18:
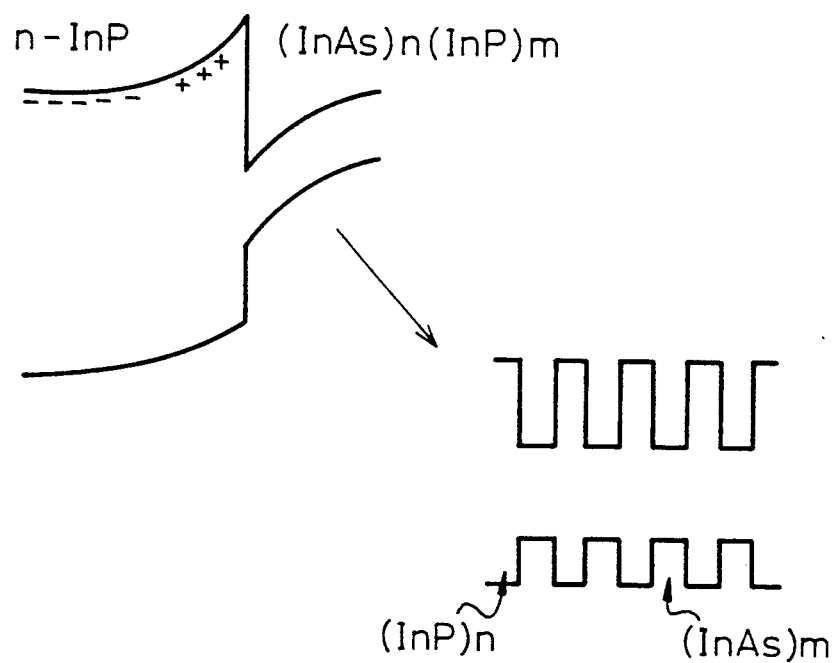

FIG. 18 shows the band energy chart of the HEMT as shown in FIG. 17. Since electrons supplied to the channel flow predominantly through the InAs rather than InAs, the $(InAs)_m(InP)_n$ channel acts almost like an InAs channel, giving a high electron mobility. Further, the periodic structure of the $(InAs)_m(InP)_n$ is controlled in the atom level by the ALE process of the present invention, the scattering of electrons, particularly by alloying at the interface of the heterojunction, is almost prevented. Generally, dislocation, etc. due to lattice misalignment between the substrate crystal and the channel layer crystal may occur, and the crystallinity of the channel portion may be deteriorated, but in accordance with the process of the present invention, the dislocation can be suppressed by varying the average composition of the channel portion by adequately selecting the m and n of $(InAs)_m(InP)_n$.

It is noted here that, in accordance with the process of the present invention, a superlattice structure having a unit layer of 20 molecular layers or less, preferably 10 molecular layers or less, more preferably 2 to 5 molecular layers or less can be made, particularly one comprising different In-containing compound semiconductors.

Figure 19:
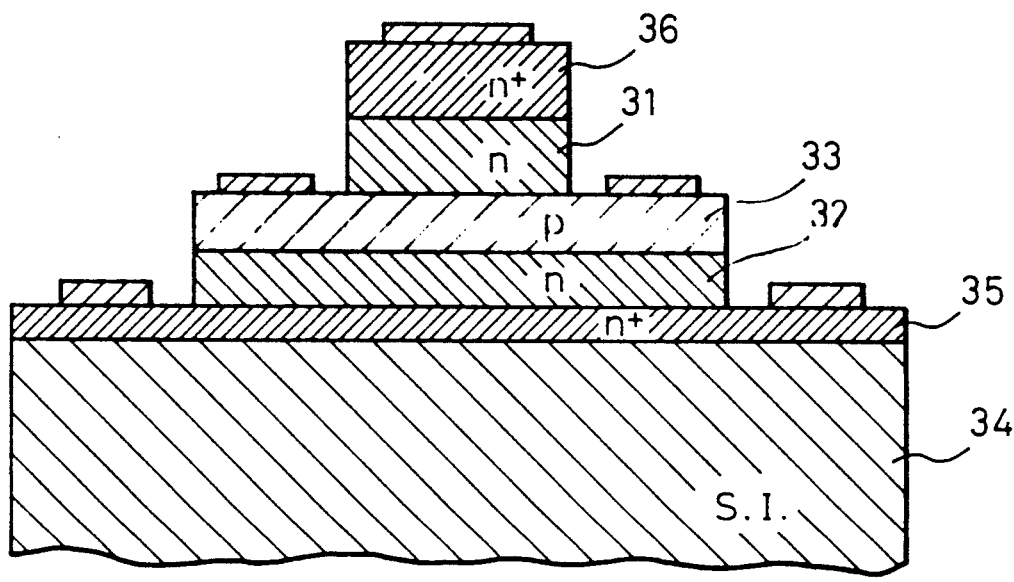
FIGS. 19 and 20 show a section of a heterojunction bipolar transistor and a bandgap thereof.
Figure 20:
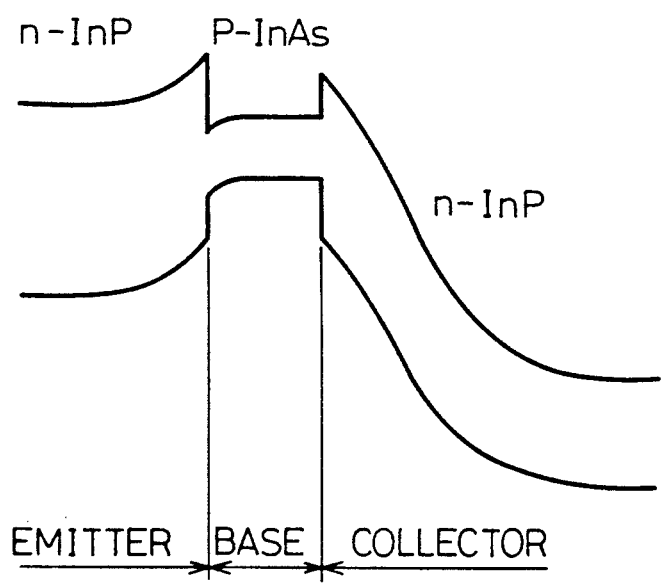

(2) FIG. 19 shows a heterojunction bipolar transistor (HBT) and FIG. 20 shows the band energy chart of the HBT as shown in FIG. 19.

An emitter 31 is n-type InP ($\sim 5 \times 10^{17}$ cm$^{-3}$) and a collector 32 is n-type InP ($10^{19} \sim 10^{20}$ cm$^{-3}$), and a base 33 is p-type InAs ($10^{19} \sim 10^{20}$ cm$^{-3}$) Thus, the interfaces between the base 33 and the emitter 31 and between the base 33 and the collector 32 are heterojunctions (double heterojunction structure). In FIG. 17, 34 denotes a semi-insulating InP substrate, 35 an n$^+$-type $In_{0.53}Ga_{0.47}As$ contact layer (more than $10^{19}$ cm$^{-3}$) and 36 an n$^+$-type $In_{0.53}Ga_{0.47}As$ contact layer (more than $10^{19}$ cm$^{-3}$).

Since the switching speed of a bipolar transistor is determined by the time of electron running from the emitter through the base to the neutral portion of the collector, and since the base is made of InAs having a high electron mobility and the band energy chart of FIG. 20 the switching speed of the HBT is very fast. This type of electronic device utilizing the high electron mobility of InAs, which has not been manufactured, can be made by utilizing an InAs/InP or the like heterojunction in accordance with the ALE process of the present invention.

We claim:

1. A process for growing a crystalline compound semiconductor, comprising the steps of:

heating a crystalline substrate to a predetermined temperature in a vacuum chamber, and at said predetermined temperature of the crystalline substrate and in the following sequence:

supplying a first source gas for a III-group element containing an organic In compound diluted with hydrogen over said crystalline substrate under a predetermined pressure, discharging the first source gas, supplying a second source gas for a first V-group element over said crystalline substrate under a predetermined pressure, discharging the second source gas, supplying a third source gas for a III-group element containing an organic In compound diluted with hydrogen over said crystalline substrate under a predetermined pressure, discharging the third source gas, supplying a fourth source for a second V-group element over said crystalline substrate under a predetermined pressure, and discharging the forth source gas, wherein said first and second V-group elements have at least different compositions or different constituent elements.

2. A process according to claim 1, wherein said steps of supplying said first and second source gases are repeated to grow a first In-containing compound semiconductor layer on said crystalline substrate, before said steps of supplying said third and fourth source gases are repeated to grow a second In-containing compound semiconductor layer on said first In-containing compound semiconductor layer.

3. A process according to claim 1, wherein said predetermined temperature is in a range of 300° to 450° C.

4. A process according to claim 1, wherein said second and fourth source gases contain hydrogen gas.

5. A process according to claim 1, wherein said discharge of the first to fourth source gases are carried out by supplying a hydrogen gas over said crystalline substrate under a predetermined pressure to thereby purge away the source gas.

6. A process according to claim 1, wherein each of said predetermined pressures in said steps of supplying said first, second, third and fourth source gases is a certain pressure in a range of 5 torr to 1000 torr.

7. A process according to claim 1, wherein said organic compound of In is trimethyl indium and said second and fourth source gases comprise arsine and phosphine.

8. A process according to claim 2, wherein a heterojunction is one selected from the group consisting of InAs/InP, InAsP/InP and InAs/InAsP.

9. A process according to claim 5, wherein in said purging steps after the steps of supplying said second and fourth source gases to adsorp the first and second V-group elements on the underlying crystalline substrate, the hydrogen gas is supplied in a short time such that the adsorped V-group element is not desorped.

10. A process according to claim 9, wherein said second and fourth source gases comprise arsin and said short time satisfies the following formula:

$$\log t \leq -(7.09/4.75)T + 7.33$$

where T stands for a temperature of the crystalline substrate in ° C. and t stands for the time of supplying the hydrogen gas, in seconds.

11. A process for growing a crystalline compound semiconductor, comprising the steps of:
supplying a III-group element source gas over a crystalline substrate,
supplying a hydrogen gas over the crystalline substrate to purge away the III-group element source gas for a time,
supplying a V-group element source gas over the crystalline substrate, and
supplying a hydrogen gas over the crystalline substrate to purge away the V-group element source gas for a time, and
repeating said steps to grow a III-V compound semiconductor layer on the crystalline substrate,
wherein said time of supplying the hydrogen gas for said purge is controlled to thereby control a growth rate of said compound semiconductor.

12. A process for growing a crystalline compound semiconductor, comprising the steps of:
supplying a III-group element source gas over a crystalline substrate,
supplying a hydrogen gas over the crystalline substrate to purge away the III-group element source gas,
supplying a V-group element source gas over the crystalline substrate,
supplying a hydrogen gas over the crystalline substrate to purge away the V-group source gas, and
supplying a dopant source over the crystalline substrate, and
repeating the above steps to grow a doped III-V compound semiconductor layer on the crystalline substrate for a time,
wherein said time of supplying the hydrogen gas is controlled to thus control a concentration of said dopant in said doped-III-V compound semiconductor layer.

* * * * *

UNITED STATES PATENT AND TRADEMARK OFFICE
CERTIFICATE OF CORRECTION

PATENT NO. : 5,270,247
DATED : December 14, 1993
INVENTOR(S) : SAKUMA et al.

It is certified that error appears in the above-indentified patent and that said Letters Patent is hereby corrected as shown below:

Title PAGE: [75] Inventors: The last name of the third inventor should be --Ohtsuka--.

Col. 2, line 64, change "forth" to --fourth--;
line 66, change "forth" to --fourth--.

Col. 3, line 2, change "forth" to --fourth--;
line 61, delete "supplying".

Col. 11, line 33, change "superlattic" to --superlattice--;

Col. 12, line 40, change "forth" to --fourth--.

Col. 13, line 12, change "arsin" to --arsine--.

Signed and Sealed this

Eighteenth Day of October, 1994

Attest:

BRUCE LEHMAN

*Attesting Officer*  *Commissioner of Patents and Trademarks*